United States Patent [19]

Andrews

[11] Patent Number: 4,977,370

[45] Date of Patent: Dec. 11, 1990

[54] APPARATUS AND METHOD FOR CIRCUIT BOARD TESTING

[75] Inventor: Harold G. Andrews, Reading, Mass.

[73] Assignee: Genrad, Inc., Concord, Mass.

[21] Appl. No.: 280,501

[22] Filed: Dec. 6, 1988

[51] Int. Cl.$^5$ ............................................. G01R 31/02
[52] U.S. Cl. .................................. 324/158 F; 324/73.1
[58] Field of Search ............... 324/158 F, 158 P, 72.5, 324/73 P C

[56] References Cited

U.S. PATENT DOCUMENTS

| | | | |
|---|---|---|---|
| 3,931,574 | 1/1976 | Curtis, Jr. et al. | 324/158 |
| 4,099,120 | 7/1978 | Aksu | 324/158 |
| 4,164,704 | 8/1979 | Kato et al. | 324/73 |
| 4,230,985 | 10/1980 | Matrone et al. | 339/158 |
| 4,243,289 | 1/1981 | Kozel | 339/126 |
| 4,321,533 | 3/1982 | Matrone | 324/158 |
| 4,352,061 | 9/1928 | Matrone | 324/158 |
| 4,357,062 | 12/1982 | Everett | 324/158 F |
| 4,574,236 | 3/1986 | Hechtman | 324/158 |

OTHER PUBLICATIONS

*Electronics* Magazine Article, Jul. 9, 1987, pp. 40–41, "A Test Fixture that does Without all those Wires".
"Augat Pylon", information bulletin, 1/85.
Burbank et al., "Automatic Test Equipement Translator Board", IBM Technical Disclosure Bulletin, 9/78, vol. 21 No. 4, p. 1405.

*Primary Examiner*—Reinhard J. Eisenzopf
*Assistant Examiner*—Edward Urban
*Attorney, Agent, or Firm*—Nutter, McClennen & Fish

[57] ABSTRACT

A test fixture useful in testing printed circuit boards requires wire-wrapping only on a single side of a single board and is characterized by a reduced signal path length. The test fixture is provided with a translator device for conducting signals between system contact points in a testing system and contact points corresponding to selected locations on a unit-under-test ("UUT"). The translator device includes extended system pins, non-extended system pins, UUT pins and through-posts. On one side of the translator board, the UUT pins are wire-wrapped to the extended system pins wherever space allows, and otherwise to the through pins. The through pins make electrical contact to the non-extended system pins by means of conductive pads disposed on the other side of the translator board. A method of fabricating such a test fixture includes the step of computing optimal UUT and through-post locations.

2 Claims, 5 Drawing Sheets

APPARATUS AND METHOD FOR CIRCUIT BOARD TESTING

FIELD OF THE INVENTION

The invention relates to a method and apparatus for the automated testing of printed circuit boards, and more particularly to a "bed of nails" type test fixturing system used therein.

BACKGROUND OF THE INVENTION

Circuit board test fixtures are devices which are used in testing circuits and individual components of a printed circuit board, often referred to as a "unit under test" or "UUT". In use, the fixture generally holds and positions the UUT, and establishes electrical interconnections between test equipment and test points or nodes on the UUT. The test equipment typically includes signal circuitry for generating a selected excitation signal applied to the UUT test points through the fixture interconnections, and for detecting or monitoring a response signal therefrom as part of a manufacturer's quality assurance testing program or as a diagnostic procedure during circuit board repair and servicing.

One type of test fixture is the so-called "bed of nails" device, which, as the name suggests, has an array of spring-loaded contact probes which support and make electrical contact with the UUT. The probes are mounted at fixed locations in an interface plate in registration with all desired test points on the circuit board. The probes are electrically wired at their other ends to the test signal circuitry. During testing, the UUT is disposed in the test fixture, which is typically within or equipped with a press for the application of pressure to make the requisite probe-to-UUT contacts.

Although known versions of such test fixtures are generally suitable for their intended purpose, certain inherent limitations have been identified. One such limitation stems from the fact that each different UUT will generally have test points arranged in a grid pattern unique to that UUT. For testing, the fixture's probes are arranged in the identical grid pattern. To appreciate how this can be problematical, consider a typical test fixture having a field of a thousand probes mounted in the interface plate on 100 to 200 mil centers, and in accurate registration with the UUT test points. The interface plate has to be designed and manufactured, and all probes individually wired, specifically for the particular UUT. If any modification is made to the printed circuit board components or circuitry that necessitates a change in the location of its test points, the test fixture must be redesigned and often rebuilt to account for the change in the grid pattern. Then the probes must be again wired to the test circuitry. This can be a costly matter for typical test fixtures used today.

Needless to say, a different test fixture is typically designed, built and stored (when not in use) for each circuit board layout to be tested. The attendant costs can be quite high. Desirable is an approach to test fixture design which affords more flexible, versatile and long-lived test fixtures. Such improved fixtures should lend themselves to more inexpensive and efficient design, fabrication and modification to accommodate any of a wide variety of probe patterns.

More-elaborate fixturing systems have been proposed to provide this flexibility, for instance, using wire wrap technology. In Matrone et al., U.S. Pat. No. 4,230,985, a fixturing system is described in which the UUT is mounted on a "bed of nails" type unit, called an "access unit". The access unit has a universal matrix platen provided with a plurality of spring-loaded, conductive test probes extending from the side of the top plate facing the UUT for pressure contact with the UUT test points. Each test probe also extends beyond the other side of the platen so as to provide a test post. These test posts are wire-wrapped to a fixed field of contact posts mounted in a contact panel, which is spaced inboard from the platen and disposed on the bottom of the access unit. The contact posts are shown as being located beneath a side edge of the platen. In other words, the contact posts are laterally offset from the field of test probes and posts. The contact panel makes individual electrical connections between the test circuitry system and the test probes contacting the UUT.

This arrangement suffers disadvantages for certain applications. The Matrone system unfortunately requires relatively long wires in the test path connecting the probes to the laterally-offset contact posts. The resultant duration of signal reflections caused by impedance mismatches between the UUT and the test circuitry can adversely affect test results. Also, as indicated above, this arrangement requires wire wrapping both on the bottom side of the platen and on the top side of the contact panel. To require a wire wrapping tool to access those plates from opposite sides needlessly complicates the wiring process.

U.S. Pat. No. 4,099,120 to Aksu also describes a fixturing system with a laterally displaced contact field. In Aksu, a plate head provides a "probe contact bearing area," on which the test unit is mounted, and a laterally displaced "interfacial contact bearing area," which includes a fixed field of contact posts which engage a corresponding field of spring-loaded probes connected to the test apparatus. The test probes in the first area are individually wired to an associated contact post in the second area. Although this system advantageously provides for all wiring to be done on a single side, the wiring to the laterally displaced second area is quite lengthy, and therefore significantly adds to the length of the test signal paths.

A further known design for fixture devices employing wire wrapping techniques also suffers certain disadvantages. In this design, a bed-of-nails type interface having spring-loaded probes mounted in a fixed two-dimensional array is positioned over circuitry of a test system. A contact board is positioned above the interface board, and includes an array of contact pins for making electrical contact (i.e., pressure contact) with the probes of the interface board. Each contact pin extends through the contact board, terminating in a wire-wrappable contact post. These contact posts are wired to the undersides of intermediate posts extending through an intermediate plate. The intermediate post tops are, in turn, wired to the test probes of a typical bed-of-nails probe plate positioned under the UUT. This fixture device's design requires wiring on a single side of several boards. The wires are relatively long, having to run to and from the interposed array of contact posts. As such, the cumulative effect of this wiring arrangement can detrimentally reduce the speed and efficiency of the circuit board tests.

SUMMARY OF THE INVENTION

A. Objects of the Invention

Accordingly, the present invention aims to provide an improved test fixture for use in testing printed circuit boards.

Another object of the invention is to provide an improved circuit board test fixture which is more readily fabricated, requiring wire-wrapping only a single side of a single test plate thereof, and has a reduced test signal path length.

Still a further object of the invention is to provide an improved method of designing and fabricating a circuit board test fixture.

It is a more general object of the invention to provide an improved circuit board test fixture which overcomes to some extent the above-mentioned limitations and inadequacies of the prior art.

Other objects of the invention will in part be obvious, and will in part appear hereinafter.

The invention accordingly comprises the features of construction, combination of elements and arrangement of parts which will be exemplified in the following detailed description, and the scope of the invention will be indicated in the appended claims.

B. Summary of the Invention

Briefly, a fixturing system according to broader aspects of the invention has a translator for conducting signals between fixed contact points in a circuit board testing system and test points on a particular unit-under-test ("UUT"). The translator has a translator board having a system face and a UUT face from which extend a plurality of system and UUT pins, respectively. These system and UUT pins are positioned thereabout for simultaneous connection with system and UUT contact points, respectively, when the UUT is disposed in a predetermined test position with respect to the testing system.

The fixturing system employs a novel approach to effecting electrical interconnection between the system and UUT pins. Certain interconnections are made by having the system pins extend through the translator board and beyond the UUT face thereof. The extended portion is then wire-wrapped to the UUT pins. The remaining interconnections are effected by employing through-posts which extend from the UUT face for wire-wrapping with the UUT pins, and conductive pads on the system face for electrically connecting the through-posts to the system pins. Each conductive pad extends through the position of an associated system pin and the through-post with which it is to be electrically connected.

With the foregoing arrangement, wire-wrapping is employed on a single side of the translator board. In a preferred practice of the invention, this is the sole board or plate of the test fixture requiring wire-wrapping.

The invention embraces not only the fixturing apparatus but also its method of fabrication. This method includes the computation of optimal UUT and through-post locations for facilitating wire-wrapping, reducing test signal path length, and improving the flexibility and versatility of the system. The resulting test fixture can be more economically manufactured, set-up, and modified to accommodate changes in the design of the printed circuit board to be tested.

BRIEF DESCRIPTION OF THE DRAWINGS

For a fuller understanding of the features, advantages, and objects of the invention, reference should be made to the following detailed description and the accompanying drawings, in which.

DETAILED DESCRIPTION OF AN ILLUSTRATIVE EMBODIMENT

Figure 1:
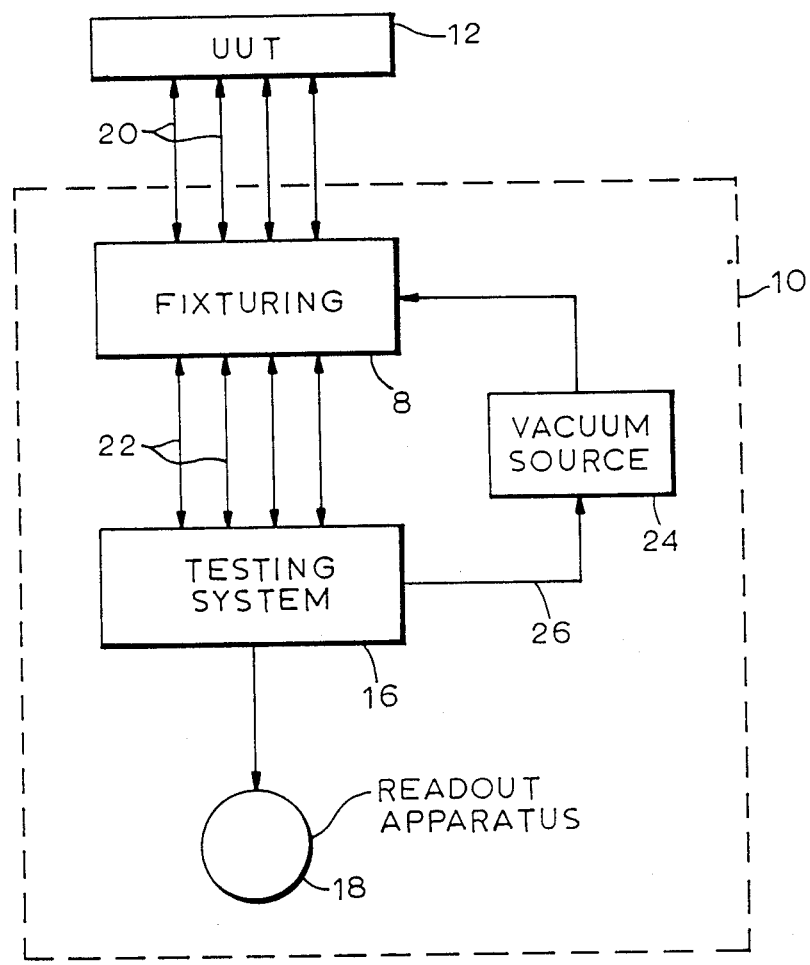
FIG. 1 is a block diagram showing the general relationship of a fixture to other components of a testing system.

As depicted in FIG. 1, the invention resides in a fixture 8, also known as a "test head," which can be advantageously employed by in-circuit/functional test equipment 10 for testing a printed circuit board 12. (The printed circuit board 12 is referred to herein as the "unit-under-test" or "UUT".) The illustrated test equipment 10 uses the fixture 8 to make a plurality of electrical connections between its testing circuitry system 16 and selected contacts on the UUT 12.

The testing system 16 typically has test, measurement, and control circuits (e.g., drivers, sensors, etc.) which serve to selectively energize the UUT contacts and detect the electrical response therefrom. The testing can be monitored and test results displayed or otherwise presented by a readout apparatus 18. The electrical interconnections between the UUT 12 and the fixturing system 8 are represented by lines 20, while the electrical interconnections between the fixturing system 8 and the testing system 16 are represented by lines 22.

The illustrated test equipment 10 utilizes vacuum-operated fixturing for providing the needed force to make low-impedance, pressure contacts, for example, between the UUT 12 and the fixture 8. For this, a vacuum source 24 is provided, controlled over line 26 by the testing system 16.

Figure 2:
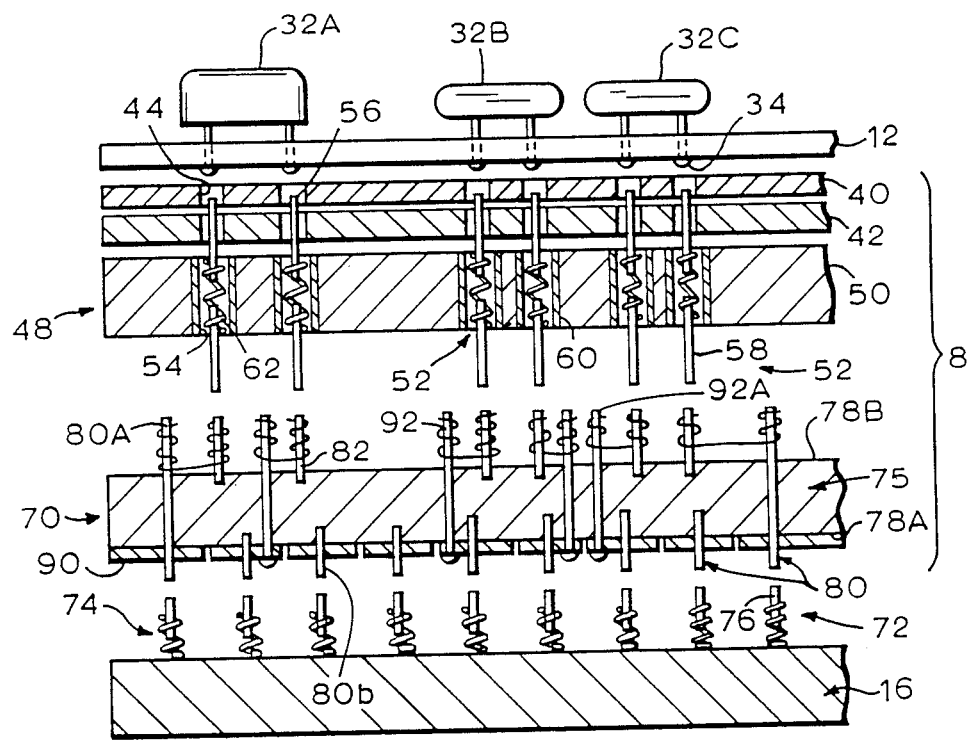
FIG. 2 is a schematic cross-section of a fixture in accordance with the present invention.

FIG. 2 shows the fixture device 8 and its interconnection with the UUT 12 and the testing circuitry system 16 in accordance with an illustrative practice of the invention. The UUT 12 is depicted in FIG. 2 as being provided with various representative electronic elements 32a, 32b, and 32c. Selected test points 34 are located on the underside of UUT 12. For convenience, only a few test points 34 are illustrated, but typical UUT's contain up to several thousand test points arranged in a grid pattern often unique to the particular UUT circuit layout.

As illustrated, the fixture 8 includes a number of generally parallel, stacked plates or boards, which will now be described.

The UUT 12 is depicted as seated on a sealing mat 40, which, in turn, is mounted on a diaphragm board 42. The sealing mat 40 is generally made of a resilient elastomer material such as rubber. The mat 40 acts as a cushion support for the UUT 12 and provides a vacuum seal when the fixture 8 is in operation. The diaphragm board 42 is a solid support for the sealing mat 40. The mat 40 and the board 42 provide the bed on which the UUT 12 is placed. As illustrated, a plurality of holes 44 are formed through mat 40 and board 42 in registration with and immediately below the test points 34.

In a typical fixturing application, a vacuum is provided beneath diaphragm board 42. This serves to pull UUT 12 down so that it seats properly on sealing mat 40, and presses together the stack of boards forming the fixture 8 so as to form simultaneously all of the pressure contacts with and within the fixture 8, as will be described below.

The fixture 8 also has a personality device 48 which serves to reproduce or convert the particular grid pattern of the UUT test points 34 into the form of electrical paths or connections. The illustrated personality device 48 includes a probe plate 50 positioned in spaced, parallel relation immediately below the diaphragm board 42 and a plurality of double-headed, spring-loaded probes 52 mounted perpendicularly within through-holes 54. Each probe 52 has conductive upper and lower pins 56, 58 longitudinally aligned in end-to-end, spaced relation, electrically coupled and resiliently mounted for axial movement towards and away from one another in a hole-lining probe receptacle 60. The resilient mount is achieved by springs 62, which, together with the receptacle 60, form a continuous conductive path between probe upper and lower pins 56, 58. The illustrated design of the spring-loaded probes used in fixture 8 is conventional.

Each probe 52 is situated for forming electrical contact with an associated one of the test points 34. More specifically, the upper pins 56 are of a diameter suitable to pass with a clearance fit through holes 44 in mat 40 and board 42, and make electrical contact with the test points 34 when suitable pressure is applied. The pressure causes the test points 34 to bear against the upper pins 56, resiliently deflecting them axially into the probe receptacle 60. The restoring forces generated by springs 62 act to assure positive contact during testing. It should be evident that for simultaneous one-to-one contact with all test points 34, the probes 52 are distributed in a grid pattern in the probe plate 50 in accordance with the particular spacing and grid pattern of the test points 34 on the UUT 12.

In accordance with the invention, a translator device 70 is provided below the personality device 48 for translating the particular grid pattern distribution of the test points 34 and probes 52 into a pre-selected, standard and preferably regular array for connection to a testing circuitry interface 72 of the test system 16, and, more specifically, to spring-loaded, single-acting probes 74 thereof having resiliently supported system contact pins 76.

The design of the translator device 70 is central to the invention. The illustrated translator device 70 has a pin-carrying translator plate or board 75 having a system face 78A on the side towards the testing circuitry 16 and a UUT face 78B on the side towards the UUT 12. The translator board 75 is shown in spaced, generally parallel relation to and interposed between the probe plate 50 and the testing system 16.

Mounted in the translator board 75 is a plurality of system and UUT pins 80, 82. The system and UUT pins 80, 82 extend perpendicularly from the system and UUT faces 78A, 78B, respectively, and are positioned thereabout for simultaneous electrical connection with the UUT 12 and testing circuitry interface 72, respectively, when the UUT is disposed in a predetermined test position with respect to the testing circuitry interface 72.

The electrical interconnection is accomplished in the illustrated embodiment by disposing the system pins 80 in registration with the contact pins 76 of the test circuitry 16; each system pin 80 is axially aligned with an associated contact pin 76 with which it forms a low-impedance electrical connection on application of a pressure adequate to resiliently compress the contact pin 76 and allow the resulting restoring forces to bear against the associated system pin 80. Analogously, the illustrated UUT pins 82 are disposed in registration with the upper pins 56 of the personality device 48; each UUT pin 82 is axially aligned with an associated upper pin 56 with which it forms a low-impedance electrical connection on application of pressure adequate to resiliently compress the upper pin 56 and allow the resulting restoring forces to bear against the associated UUT pin 82.

Certain of the system pins 80 extend through the translator board 75 and beyond the UUT face 78B thereof. These are referred to herein as "extended system pins" and are designated 80A in FIG. 2, while the non-extended system pins, which do not reach the UUT face 78B, are designated 80B. Above the UUT face 78B, the extended system pins 80A are each wire-wrapped with an associated one of the UUT pins 82.

Electrical interconnection of the system pins 80 and the associated UUT pins 82 can only be effected by the foregoing arrangement where there is no conflict in the position of the system and UUT pins 80, 82 which would render the use of an extended system pin 80A impossible or impractical since the interconnection using a wire-wrapping tool would be difficult to accomplish. In other words, where one of the UUT pins 82 is disposed above and co-axial or nearly co-axial with one of the system pins 80, the use of an extended system pin 80A is precluded and another interconnection technique must be employed.

The other interconnection technique involves the use of a plurality of elongate conductive pads 90 which are provided on the system face 78A of the translator board 75 and a plurality of through-connection posts 92. Each connection post 92 is associated with one of the conductive pads 90 and one of the UUT pins 82. The conductive pads 90 are produced, for example, by commonly known copper deposition and lithographic etching techniques. Each conductive pad 90 is associated with a different one of the system pins 80, and extends through its position for electrical connection therewith.

Figure 3:
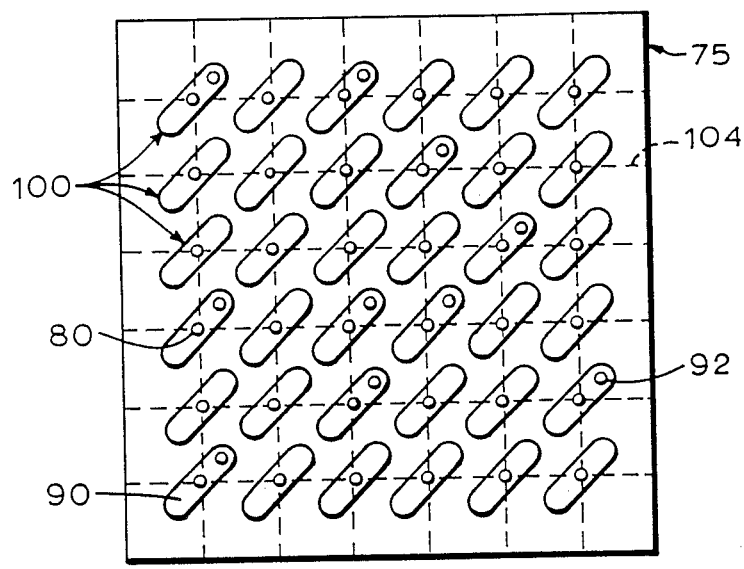
FIG. 3 is a bottom view of a translator board of the fixture of FIG. 2.

FIG. 3 pictorially represents the bottom view of the translator board 75 and illustrates the conductive pads 90 in greater detail. The conductive pads 90 appear there as elongate, diagonal elements which are arranged in parallel rows 100; Each parallel row 100 has a plurality of parallel conductive pads 90. Each system pin 80 is shown as being located approximately midway along its associated conductive pad 90.

With reference again to FIG. 2, the through-connection posts 92 extend through the translator board 74. Each illustrated through-connection post 92 terminates at its bottom end in contact with an associated conductive pad 90 to which it is physically connected by soldering, for example. Also, each has a UUT end 92A projecting from the UUT face 78B of the translator board 75 for electrical connection to the associated UUT pin 82. The illustrated connection therebetween is effected by wire wrapping techniques. Typically, the associated UUT pin 82 is selected to be the nearest neighboring UUT pin, though other pin assignments can also be made.

The reason for placing the conductive pads 90 on diagonals is related to common practices in electric component design; that is, chip pins are typically arranged either horizontally or vertically. As such, UUT test points corresponding to the chip pins are similarly arranged, thus effectively creating a grid of squares or rectangles (shown in dashed lines 104 in FIG. 3) of possible test point locations. Were the conductive pads arranged vertically or horizontally, it would be possible to have all successive through-connection post locations falling on dashed lines 104 and interfering with UUT pin locations. With a diagonally-oriented conductive pad 90, which is angularly offset, for example, at forty-five degrees with respect to the associated dashed line 104, at least one non-interfering position is likely to exist. The geometry and diagonal orientation of the conductive pads 90 advantageously permits the positional adjustment of the through-connection posts 92 so as to attain that non-interfering location without the need for custom etching of the conductive pads 90 for each design of the UUT 12 and testing circuitry 16.

By employing the described arrangement, the test point pattern of the UUT 12 is electrically connected through to the standard pattern of the test circuitry 16 in an efficient manner. It might be helpful by way of summary to trace the illustrated electrical paths from typical test points. When pressure is applied, the test point 34 contacts the probe upper pin 56, which is electrically coupled (via associated receptacle 60 and springs 62) to probe bottom pin 58. Bottom pin 58 contacts UUT pin 82. UUT pin 82 is wire-wrapped to extended system pin 80A or to through-connection post 92. Where wire wrapping is to through-connection post 92, an electrical connection to non-extended system pin 80B is achieved through conductive pad 90. System pin 80A or 80B contacts the contact pin 76 of the test circuitry 16, completing the through-connection.

In order to be able to connect more than one system contact pin 76 to a single UUT test point 34 and thereby increase the wiring layout flexibility of fixture 8, each pin extending from the UUT face 78B (including the UUT pins 82, extended system pins 80A and through-connection posts 92) can accommodate wirewrapping to more than one other pin.

Advantageously, with the foregoing arrangement wire wrapping is required on a single side of only the translator board 75, and then only over short inter-pin distances. Accordingly, with the illustrated arrangement, assembly and wiring of the fixture 8 is facilitated. This arrangement also achieves a reduced signal path length since board-to-board wiring is eliminated.

This fixture arrangement accommodates any of a variety of different test point patterns, and effectively and efficiently converts it into the standard pattern of the interface contact pins 76. In so doing, system and UUT pin positions are dictated by the respective UUT and system circuitry layout.

The UUT and system circuitry layout also dictates whether each electrical interconnection can be effected using one of the extended system pins 80A, or both a non-extended system pin 80B and a through-connection post 92.

It is advantageous to use the extended system pins 80A so as to reduce the need for the through-connection posts 92 and thereby reduce total pin count for the fixture 8. A priority is given, therefore, during the design of the fixture 8 to the use of extended system pins 80A; however, in order to do so, no conflict can exist between the involved system and UUT pin locations. Conflicts are not merely a matter of being able to fit the extended system pins 80A on the face 78B—there must be sufficient space to accommodate the spacing needs for wire-wrapping associated pins.

For example, commonly used wire-wrap guns are unable to operate at wire-wrap pin spacings of less than 0.095 inches (0.24cm), which is called the "shadow spec." For this reason, the lateral distance between each pin to be wire-wrapped and all its neighboring pins on the UUT face 78B must be at least slightly greater than the shadow spec. Where a conflict exists such that use of an extended system pin 80A would not comply with the shadow spec, a through-connection post 92 is used. The latitude afforded by the movement of the through-connection post 92 along the conductive pad 90 makes it easier to comply with the shadow spec.

The layout of the translator device 70 must take into account several of the factors mentioned above, namely, electrical path length, pin conflict, and shadow spec. Optimizing the design of a particular translator device 70 can be accomplished by using a novel method which shall now be described.

Figure 4:
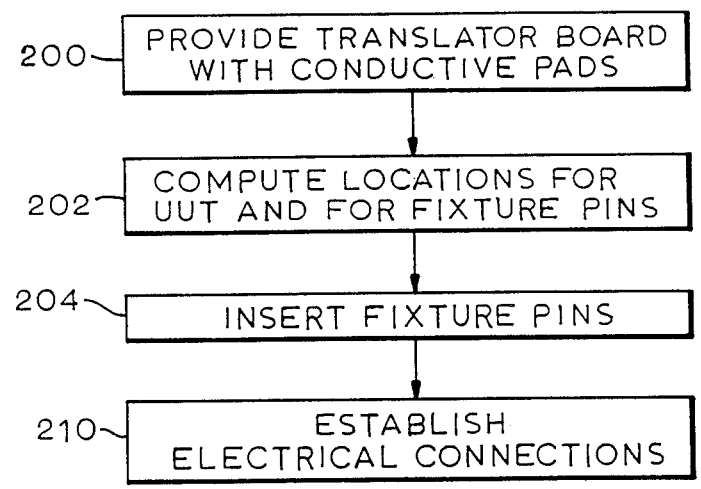
FIG. 4 is a flow chart illustrating a method of fabricating the fixture of FIG. 2 in accordance with the invention.
Figure 5:
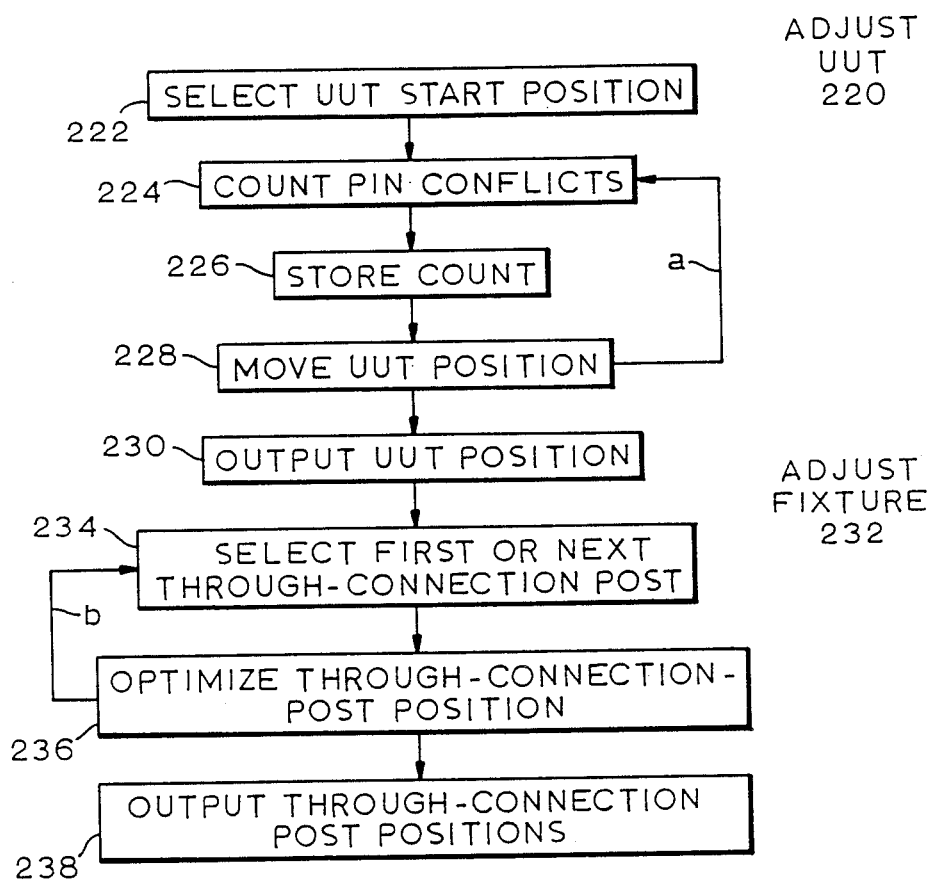
FIG. 5 is a flow chart illustrating a method of computing UUT and through-connection-post locations along the FIG. 3 translator board in accordance with the invention.

A fabrication method which takes these factors into account is illustrated in block-diagram form in FIGS. 4 and 5. Essentially, the method entails the calculation of an optimal position, first, of the UUT 12 on the fixture device 8 and, second, of each through-connection post 92 on the associated conductive pad 90, prior to assembly of the fixture device 8. In other words, once pairings between system contact pins 76 and test points 34, and thus between system and UUT pins 80, 82, have been determined the position of the UUT 12 is adjusted within the spatial repeat period of the system pins 80 so as to minimize conflicts between system and UUT pins 80, 82 and maximize use of extended system pins 80A. Afterwards, for the UUT pins 82 not paired with extended systems pins 80A, the through-connection posts 92 are positioned along the associated conductive pads 90.

This procedure will now be discussed in greater detail, referring specifically to FIG. 4. The illustrated fabrication method starts in BLOCK 200 with the provision of a translator board 75 having conductive pads 90 as described hereinabove. Unlike prior art approaches in which UUT's were placed at the geometric center of the test fixture with potential pin locations limited thereby, the present invention proposes the use of a computer to process potential locations of the UUT 12 on the fixture 8 as well as potential positions of the through-connection posts 92 on the conductive pads 90 to optimize the design of the fixture 8. BLOCK 202. When optimal locations have been identified, the system pins 80, UUT pins 82, and through-connection posts 92 are installed in the fixture 8 accordingly, as represented by BLOCK 204. The order of installation is not of consequence for purposes hereof. Electrical connection between the UUT pins 82 and both the extended system pins 80A and the through-connection posts 92 is effected by wire wrapping, between the through-connection post 92 and the conductive pads 90 is assured by soldering, for example, and between the conductive pad 90 and the non-extended system pin 80B is effected by press fitting the pin into a plated-through hole in the conductive pad 90. BLOCK 210. Afterwards, the fixture 8 is ready for use.

FIG. 5 illustrates an exemplary approach to the computer calculation of optimal locations for the UUT 12 connection posts 92.

A first subroutine 220 called "Adjust UUT" finds an optimal UUT position. As represented by BLOCK 222, the initial step in determining UUT position on the fixture 8 is the selection of an arbitrary start position for the UUT 12. The initial UUT position can be, for example, at the geometric center of the fixture 8. The initial position is identified, for example, using Cartesian coordinates. In BLOCK 224, the "system-pin-to-UUT-pin" conflicts for the initial UUT position are counted. The pin conflicts can be defined in any suitable manner, so long as they take into account the shadow spec. The number of conflicts is stored in association with the corresponding UUT position (BLOCK 26). Afterwards, the position of the UUT 12 is moved or shifted preferably in translation along a Cartesian axis, either "x" or "y", as indicated in BLOCK 228. The counting, storing and moving steps all are repeated (as indicated by arrow "a") in an iterative or loop fashion until all or a significant number of potential UUT locations have been tried along that axis, and a histogram of conflicts has been developed and stored. Subsequently, this process is repeated to generate a histogram of conflicts for positions along the other axis. A UUT position identified by those "x" and "y" coordinates having the fewest conflicts is selected as the optimal position for purpose of further calculation, and is read out as the result of the "Adjust UUT" subroutine (BLOCK 230).

In evaluating the UUT-pin-to-system-pin conflicts, not all have to be treated with equal weight in determining the optimal UUT position. For example, in many instances, conflicts between signal points are more desirably avoided than conflicts between ground points. The reason for this is that there typically are numerous ground points, while the signal points are often unique. If a ground point conflict exists and can not be eliminated, then connection to another ground point can be accomplished by wire wrapping the involved UUT pin to another ground-point-connecting pin, whether an extended system pin 80B or a through-connection post 92. As such, the histogram preferably keeps separate tallies or sub-totals of signal and ground point conflicts. The UUT positions with the fewest signal point conflicts can be selected for further evaluation on the basis of the ground point conflicts, so as to minimize them as well.

Having selected an optimal UUT position, the location of each required connection post 92 along its associated conductive pad 90 is then calculated in an "Adjust Fixture" subroutine 232 so as to assure compliance with the shadow spec. As an initial step, represented by BLOCK 234, a starting position is chosen for a first through-connection post 92, and then the through-connection post 92 is moved along its associated conductive pad 90 so as to minimize its distance from the associated UUT pin 82, while complying with the shadow spec (BLOCK 238). This is repeated (arrow "b") for each through-connection post 92 until positions for all through-connection posts 92 have been computed. The computed positions are then outputted (BLOCK 238).

In this fashion, an improved fixturing device can be efficiently designed and fabricated, employing wire-wrapping on only a single board side, and at the same time providing a reduced signal path length therethrough.

The foregoing description has been limited to a specific embodiment of this invention. It will be apparent, however, that variations and modifications may be made without departing from the spirit of the invention.

It is accordingly intended that all matter contained in the above description or shown in the accompanying drawings be interpreted as illustrative rather than restrictive, with the scope of the invention being indicated by the appended claims. All changes which come within the meaning and range of equivalency of the claims are therefore intended to be embraced herein.

Having described this invention, what is claimed as new and secured by Letter Patent is:

1. For fabricating a translator device for conducting signals between a plurality of system contact points in a testing system and a plurality of contact points corresponding to selected locations on a particular unit-under-test (UUT), a method comprising the steps of:
   A. providing a translator board including a system face and a UUT face, the system face having a plurality of system locations thereon each associated with one of the system contact points, said system locations positioned for simultaneous registration with said associated system contact points, the translator board further including a plurality of conductive pads provided on said system face, each conductive pad extending through a different one of the system locations;
   B. at each of said system locations, mounting a system pin in electrical contact with the associated conductive pad that extends therethrough, the system pins including a plurality of extended system pins and a plurality of non-extended system pins, each extended system pin having a UUT end extending beyond the UUT face;
   C. in association with each of said non-extended system pins, inserting a conductive connection post through the translator board so that said connection post has a UUT end at the UUT face and extends, at a position laterally spaced from that of the associated non-extended system pin, from the UUT face through the translator board and into electrical contact with the conductive pad with which the associated non-extended system pin is in electrical contact;
   D. in association with each extended system pin and connection post, mounting a UUT pin on the UUT face and providing electrical communication between the UUT pin and the UUT end of the associated extended system pin or connection post; and
   E. computing an optimal location of said UUT with respect to said translator board so as to minimize conflicts between UUT pins and system pins, and maximize the use of extended system pins.

2. The method in accordance with claim 1 further including the step of computing an optimal location for each of said connection posts along said conductive pads.

* * * * *